United States Patent [19]

Verbanets

[11] Patent Number: 5,606,291
[45] Date of Patent: Feb. 25, 1997

[54] MINIATURE ATOMIC FREQUENCY STANDARD CONTROLLED BY A DIGITAL PROCESSOR

[75] Inventor: William R. Verbanets, Plum Borough, Pa.

[73] Assignee: Northrop Grumman Corporation, Los Angeles, Calif.

[21] Appl. No.: 554,024

[22] Filed: Nov. 6, 1995

[51] Int. Cl.⁶ ........................................................ H03L 7/26
[52] U.S. Cl. .............................................. 331/3; 331/94.1
[58] Field of Search ........................................ 331/94.1, 3

[56] References Cited

U.S. PATENT DOCUMENTS 5,148,437  9/1992  Ohtsu ........................................... 331/3
5,192,921  3/1993  Chantry et al. ............................. 331/3
5,442,326  8/1995  Liberman ................................. 331/94.1

*Primary Examiner*—Siegfried H. Grimm
*Attorney, Agent, or Firm*—Philip A. Florenzo

[57] ABSTRACT

A digital controller time multiplexes dithering of the microwave frequency control signal and a laser wavelength control signal in a miniaturized cesium vapor atomic frequency standard. A unique common charge/sample and dump integrator amplifies the photodetector output for the + and − dither of both the laser current and microwave frequency. To suppress error in the integrated photodetector output attributable to noise generated by the digital processor, the processor is placed in a sleep mode during the integration intervals. To further suppress errors, the cesium vapor electric heaters are not energized during the intervals when the microwave signal is being dithered.

12 Claims, 12 Drawing Sheets

MINIATURE ATOMIC FREQUENCY STANDARD CONTROLLED BY A DIGITAL PROCESSOR

This invention was made in the performance of the U.S. Government, Department of Defense, U.S. Air Force Contract No. F33615-94-C-1477.

BACKGROUND OF THE INVENTION

1. Field of the Invention

This invention relates to a miniaturized atomic frequency standard of the type in which a microwave oscillator is tuned to the hyperfine frequency of a vapor pumped by a laser diode, and more particularly to control of the oscillator, laser diode and associated components using a digital processor.

2. Background of Information

A known type of atomic clock tunes a microwave oscillator to the hyperfine wavelength of a vapor such as cesium or rubidium. A light beam passed through the vapor pumps the atoms from the ground state to a higher state from which they fall to a state which is at a hyperfine wavelength above the ground state. Absorption of the light in pumping the vapor atoms to the higher state is detected by a photodetector. When the ground state becomes depleted the light passing through the vapor to the detector increases. However, with the microwave signal tuned to the hyperfine wavelength, the ground state is repopulated so that light is continuously absorbed in pumping the vapor atoms. Thus, the response of the detector to the light signal exhibits a dip at the exact wavelength at which the vapor atoms are pumped to the higher state. The microwave frequency must also be at the precise hyperfine frequency to produce the maximum absorption of the light, and therefore, the minimum photodetector signal.

With a stable light source, the microwave oscillator is precisely tuned to the hyperfine frequency using the photodetector output circuit in a feedback loop. In order to lock onto the dip and therefore the hyperfine frequency, the microwave frequency is dithered, that is, it is modulated between two frequencies. The feedback circuit drives the microwave frequency to center the dithered response signal of the photodetector on the precise hyperfine frequency.

The laser beam is also stabilized by a feedback circuit which dithers the laser wavelength to lock the laser on the precise wavelength which pumps the vapor atoms to the excited state. The analog feedback circuits controlling the microwave frequency and laser wavelength use frequency multiplexing to decouple modulation of the two signals. This requires separate phase detectors for each of the feedback loops.

There is a trend to reduce the size and power requirements of atomic frequency standards which would significantly expand their usefulness. U.S. Pat. No. 5,192,921 discloses a miniature cell type atomic frequency standard in which the gas cell is no more than about 6 mm in diameter and 18 mm long. When cesium gas is used, known analog circuits as described above can be used with this gas cell to produce a frequency standard with a total volume of less than about 25 cm$^3$. However, the separate phase detectors needed to extract the respective feedback signals for the microwave and laser control loops restrict further miniaturization of these analog circuits.

There is a need therefore for an improved atomic frequency standard with a smaller total size, including control circuits, than is now available.

There is a related need for such a reduced size atomic frequency standard which is stable and reliable, and can be produced for a reasonable cost.

There is a further need for such an atomic frequency standard which has reduced power requirements both as to amount of power drawn and quality of power needed.

SUMMARY OF THE INVENTION

These needs and others are satisfied by the invention which is directed to an atomic frequency standard which incorporates a digital controller for controlling the wavelength of the light source, the frequency of the microwave signal, the vapor and laser temperature controls and the C-field current. The digital controller time multiplexes dithering of the light control signal to lock the wavelength of the light source, which is preferably a laser diode, to the optical resonant frequency of the vapor and the dithering of the microwave control signal to lock the frequency of the radio frequency synthesizer on the microwave resonant frequency. This decouples the laser and microwave control loops and eliminates the need for the expensive phase detectors required in the analog control circuits for atomic frequency standards. In a unique approach to accommodating for the small differences in the output of the photodetector during dithering, especially in the case of the microwave signal, the detector signal is integrated in a charge/sample and dump integrator. In the exemplary embodiment of the invention gains in the range of 50 in the case of the microwave signal and in the range of 20 in the case of the laser signal are realized. Since the dithering of the laser signal and the microwave signal are time multiplexed, a common charge/sample and discharge integrator is used which further reduces the size and the cost of the clock. In order to reduce error resulting from noise produced by the digital signal processor, the processor is placed in the sleep mode during the intervals that the photodetector signal is being integrated.

As the electrical heater for maintaining the operating temperature of the vapor can interfere with the operation of the microwave cavity, the digital controller only energizes these heaters during intervals when the microwave signal is not being integrated.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
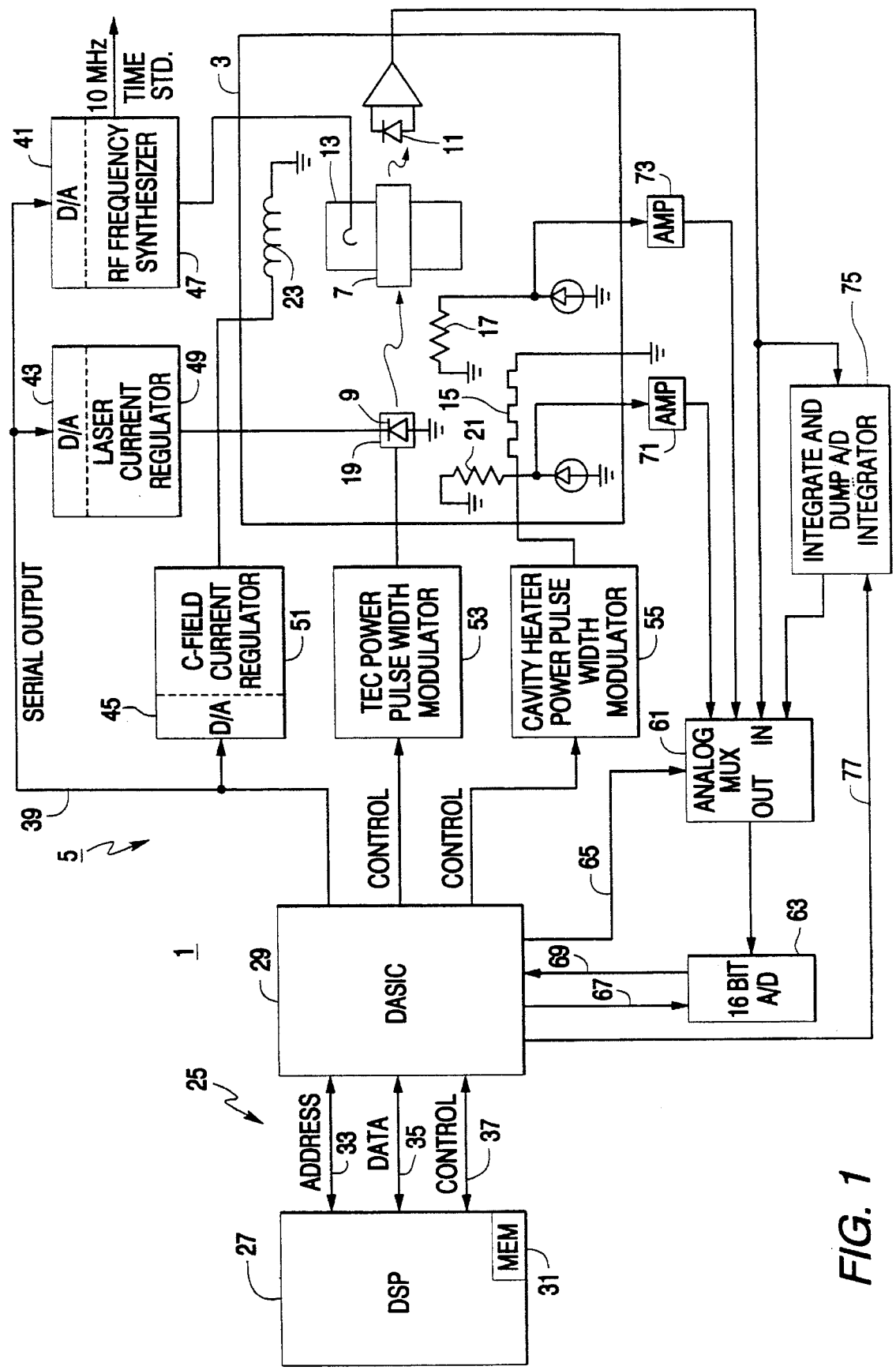
FIG. 1 is a schematic diagram in block diagram form of an atomic frequency standard in accordance with the invention.

The atomic frequency standard of the invention is a miniature, microprocessor-based, 10 MHz oscillator. Oscillator stability is achieved by tuning a radio frequency (RF) signal to a hyperfine transition of cesium gas. A hardware block diagram of the atomic frequency standard 1 is shown in FIG. 1. The atomic frequency standard 1 includes a physics package 3 and control circuitry 5. The physics package 3 includes a miniature cesium cell 7 such as that described in U.S. Pat. No. 5,192,921 which is hereby incorporated by reference. Preferably, the physics package is of the type shown in copending application Ser. No. 08/533,301 filed Sept. 25, 1995 which is also incorporated by reference. A laser diode 9 generates a beam of coherent light which pumps the cesium vapor in the cell 7. Absorption of the light beam by the cesium vapor is detected by a photodetector 11. The microwave signal is coupled to the cesium vapor by a microwave cavity 13 in which the vapor cell 7 is mounted. As mentioned, the microwave signal is tuned to the microwave atomic transition frequency of the cesium vapor so that the ground state of the vapor is repopulated and the laser diode can continuously pump the cesium atoms. In order to generate the required vapor pressure in the vapor cell 7 and for stable operation, the vapor is heated by an electric heater 15. The temperature of the vapor is monitored by a cesium thermistor 17. For stable operation, the temperature of the laser diode 9 must also be controlled. As this temperature could be below ambient conditions, a thermal electric cooler/heater (TEC) 19 is utilized and the temperature of the laser diode 9 is monitored by a laser thermistor 21. A C-field coil 23 generates a uniform background magnetic field which minimizes the effects of external magnetic fields. In addition, a magnetic field shield (not shown) further isolates the cesium cell from external fields.

The heart of the control circuitry 5 is a digital controller 25 which includes a 16 bit digital signal processor (DSP) 27 and a Digital Applications Specific Integrated Circuit (DASIC) 29. The DSP 27 is a specialized type of microprocessor optimized for digital filtering and control. The exemplary DSP is a Texas Instruments TMS320C50 microprocessor. The digital controller 25 governs the operation of the physics package 3 through the execution of software loaded into the DSP's program memory 31 and through control and timing signals generated by the DASIC 29. The DASIC 29 includes a number of timers which perform a number of timing functions including generating interrupts for the DSP 27. The DSP 27 communicates with the DASIC 29 through the 16 bit parallel address and data buses 33 and 35, respectively, and a control bus 37. The DASIC 29 also serves as an interface for the DSP 27 by converting the messages generated on the parallel address and data busses 33 and 35 for transmission on a serial output bus 39 to the digital-to-analog (D/A) converters 41, 43 and 45 of the RF frequency synthesizer 47, the laser current regulator 49, and the C field current regulator 51. As will be seen, DSP 27 provides the D/As with set point values for the associated control parameters.

The DASIC 29 also provides a control signal to a power pulse width modulator 53 for the TEC 19 and a similar control signal for the power pulse width modulator 55 for the vapor heater 15.

The control circuitry 5 also includes components for inputting into the digital controller 25 the analog signals generated by the photodetector 11, the cesium thermistor 17 and the laser thermistor 21. These signals are input to an analog multiplexer (analog mux) 61 and converted into digital form by a 16 bit A/D converter 63. Selection of the signal to be digitized is determined by a control signal supplied by the DASIC 29 to the analog mux 61 over the control lead 65. The DASIC 29 provides control signals to the A/D converter 63 over the control lead 67 and receives the selected digitized signal over the serial input bus 69.

The analog laser thermistor and cesium thermistor signals are amplified by the amplifiers 71 and 73 before they are digitized. At the times when the laser signal is dithered and at other times when the microwave signal is dithered, the difference in the level of the photodetector signal at the two dither frequencies is very small, especially in the case of the microwave signal. Accordingly, the photodetector signal is amplified by a novel integrate and dump A/D integrator 75 which will be described in more detail below. This integrator is also controlled by the DASIC 29 over the lead 77.

Figure 2:
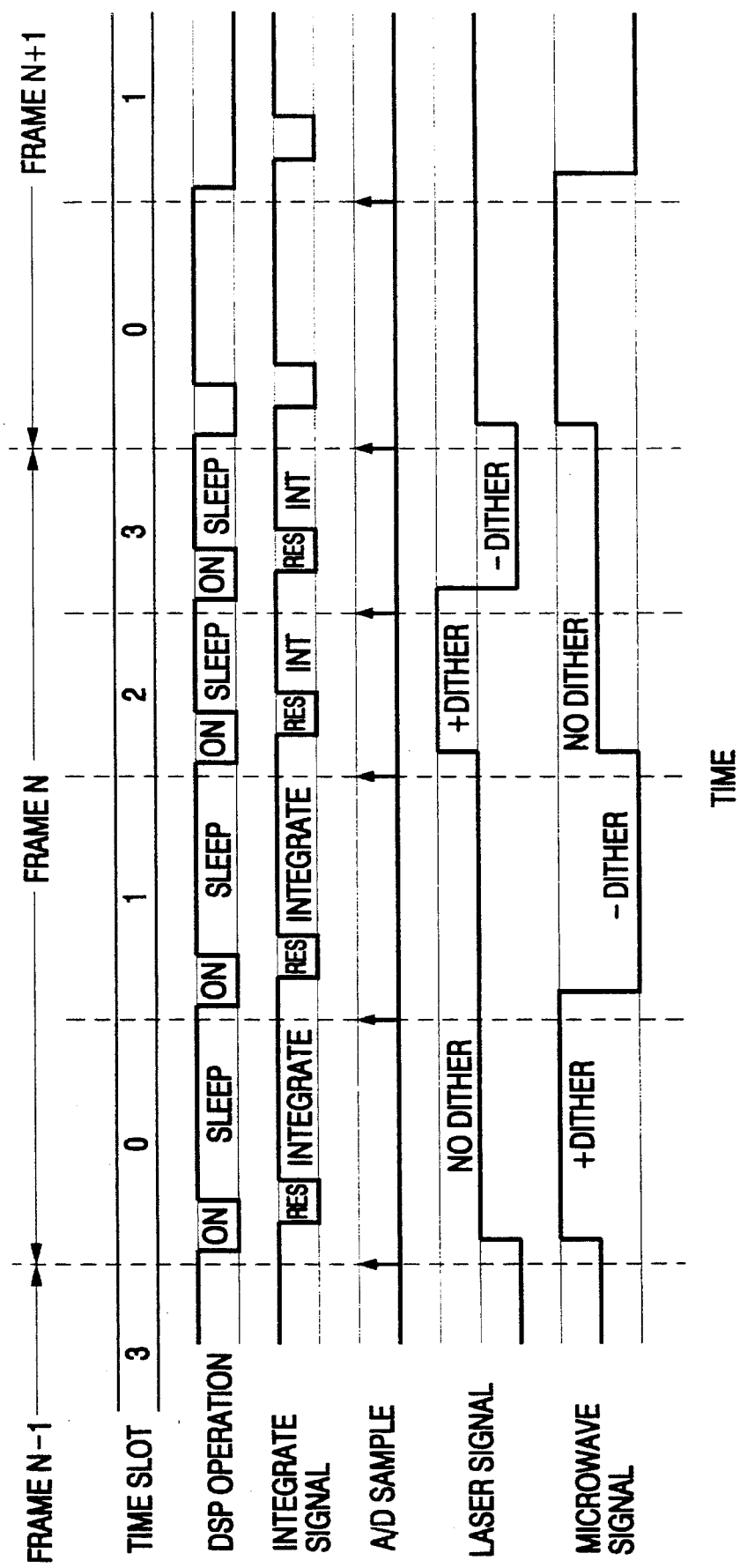
FIG. 2 is a timing diagram illustrating the relative timing of various signals used by the atomic frequency standard described in FIG. 1.

As previously mentioned, both the microwave signal and the laser signal are dithered in order to maintain the laser signal locked onto the laser absorption wavelength and to maintain the microwave signal locked onto the microwave absorption frequency, as is known. However, in accordance with the invention, dithering of the microwave signal and the laser signal is time multiplexed. Timing signals for the time multiplexing of the dithering of the laser signal and the microwave signal as well as other timing signals are generated by the DASIC 29. Pertinent timing signals generated by the DASIC are illustrated in FIG. 2. The basic time interval is the frame which is divided into four time slots, 0, 1, 2, and 3. Time Slots 0 and 1 are associated with positive and negative dithering of the microwave signal respectively while the laser signal is switched to the positive dither wave length in Time Slot 2 and the negative dither wavelength in time slot 3. As the difference in the positively and negatively dithered microwave signal are smaller than those for the laser signal, the microwave signal is integrated over a longer time interval in order to increase the amplification. Thus, in the exemplary system where the duration of the frame is 10 ms, Time Slots 0 and 1 are 3 ms each and Time Slots 2 and 3 are each 2 ms. The relative duration of the time slots can be varied depending upon the amplification desired. The essential feature is, however, that the integration time for the positive and negative dither of a particular signal must be the same to avoid the introduction of error. As indicated from FIG. 2, the integrated signal is read when an A/D sample signal is provided to the A/D converter 63 over the control lead 67. The DASIC 29 also provides the integrate signal shown in FIG. 2 to the integrator 75 over the lead 77 to reset the integrator for each new integration. When this integration signal goes low the integrator is cleared. It is the interval between when the integration signal goes high to start the integration and when the next A/D sample signal is generated that determines the integration interval. For the microwave signal, the integration period is 2 ms and the integration period for the laser signal is 1 ms in the exemplary embodiment of the invention.

As also mentioned previously, because the difference in the amplitude of the photodetector signal for positive and negative dithering, especially in the case of microwave signal, is very small, the activity of the digital signal processor 25 is reduced during the integration period to prevent noise generated by full operation of the DSP from introducing error into the measured photodetector signal. Thus, as shown in FIG. 2 the DSP is only turned on for a very short interval at the beginning of each time slot. The burden on the DSP is such that all of its functions can be performed during these short intervals. This is facilitated by distributing the tasks between the slots so that all of the tasks are performed at least once during each frame.

It will be noticed from FIG. 2 that at the beginning of each time slot, the signal integrated during the previous time slot is first read by generation of the sample pulse on the A/D sample control signal. The DSP 27 is then turned on and begins performing its tasks. One of its initial tasks is to set the dither on the laser and/or microwave signal. This must clearly not occur until after the integrated signal is read. While the system is accommodating to the new level of the laser and/or microwave signal, the integrate signal goes low to reset the integrator. After the DSP 27 has completed its tasks and goes to sleep, the integrate signal goes high to start the next integration. As will be discussed, the laser thermistor and cesium thermistor signals are read during different on periods of the DSP 27.

Figure 3:
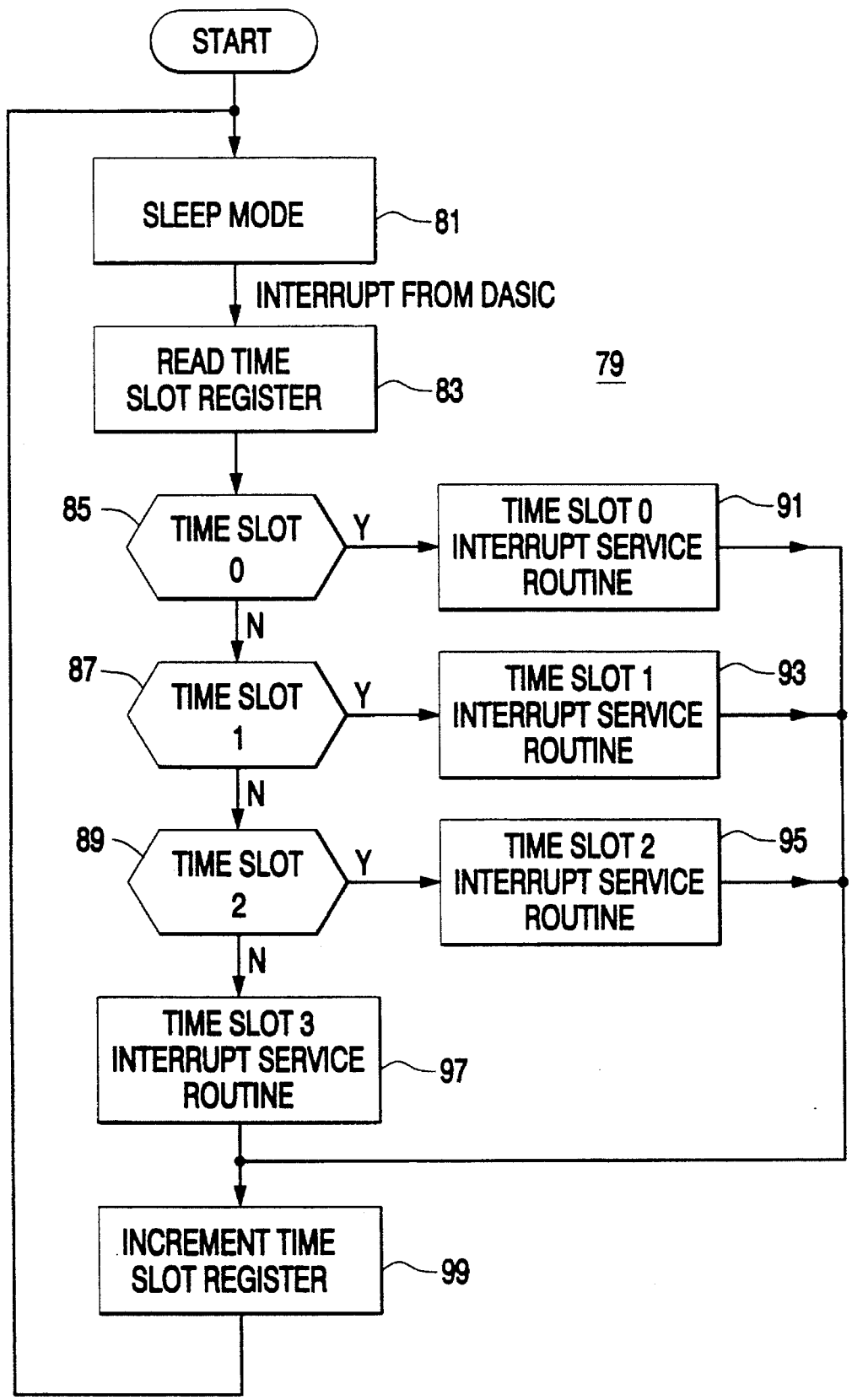
FIG. 3 is a flow chart for a main software routine used by a digital processor which forms part of the atomic frequency standard of FIG. 1.

FIG. 3 illustrates the flow chart for the main software routine 79 for the DSP 27. Upon start-up, the DSP is in the sleep mode as indicated at 81. At the beginning of each time slot, the DASIC 29 sends an interrupt which prompts the DSP to read a register at 83 which indicates the number of the time slot. Depending upon the number of the current time slot as determined at 85, 87 and 89 the appropriate time slot interrupt service routine is called at 91, 93, 95 or 97. Upon return from the selected interrupt service routine, the time slot register is incremented at 99 before the DSP goes back into the sleep mode at 81.

Figure 4:
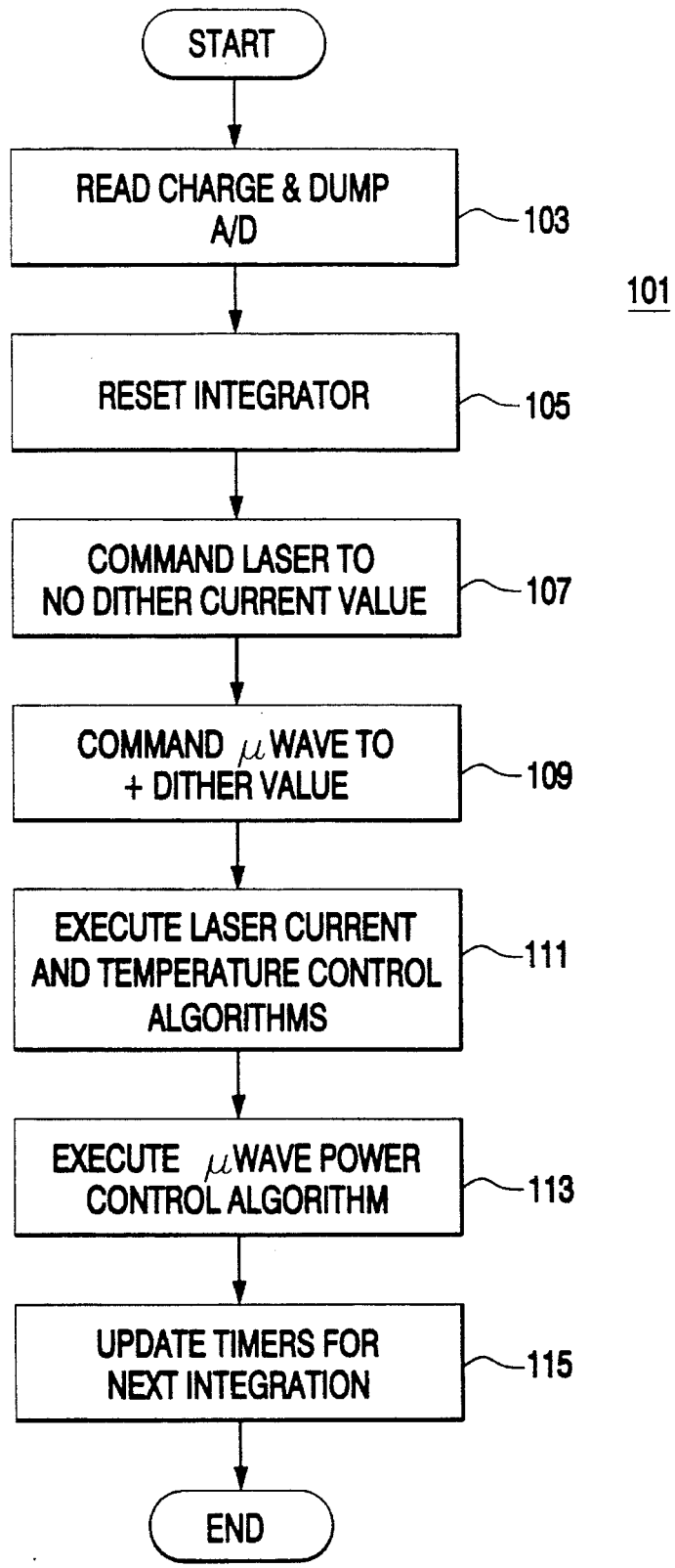
FIGS. 4–7 are flow charts for interrupt service routines called by the main routine of FIG. 3.

The flow chart for the Time Slot 0 interrupt service routine 101 is illustrated in FIG. 4. When the routine is called, the A/D converter 63 is read at 103 and the integrator is reset at 105. Next, the no dither current value is sent to the laser current regulator D/A converter 43 at 107 and the positive dither current value is sent to the RF frequency synthesizer D/A converter 41 at 109. Following this, the laser current and temperature control algorithms are run at 111 and the microwave power control algorithm is run at 113. Finally, the start and sample times for the integration during this time slot are set at 115. The sample time also serves as an interrupt for the DSP 27 to start the next time slot.

Figure 5:
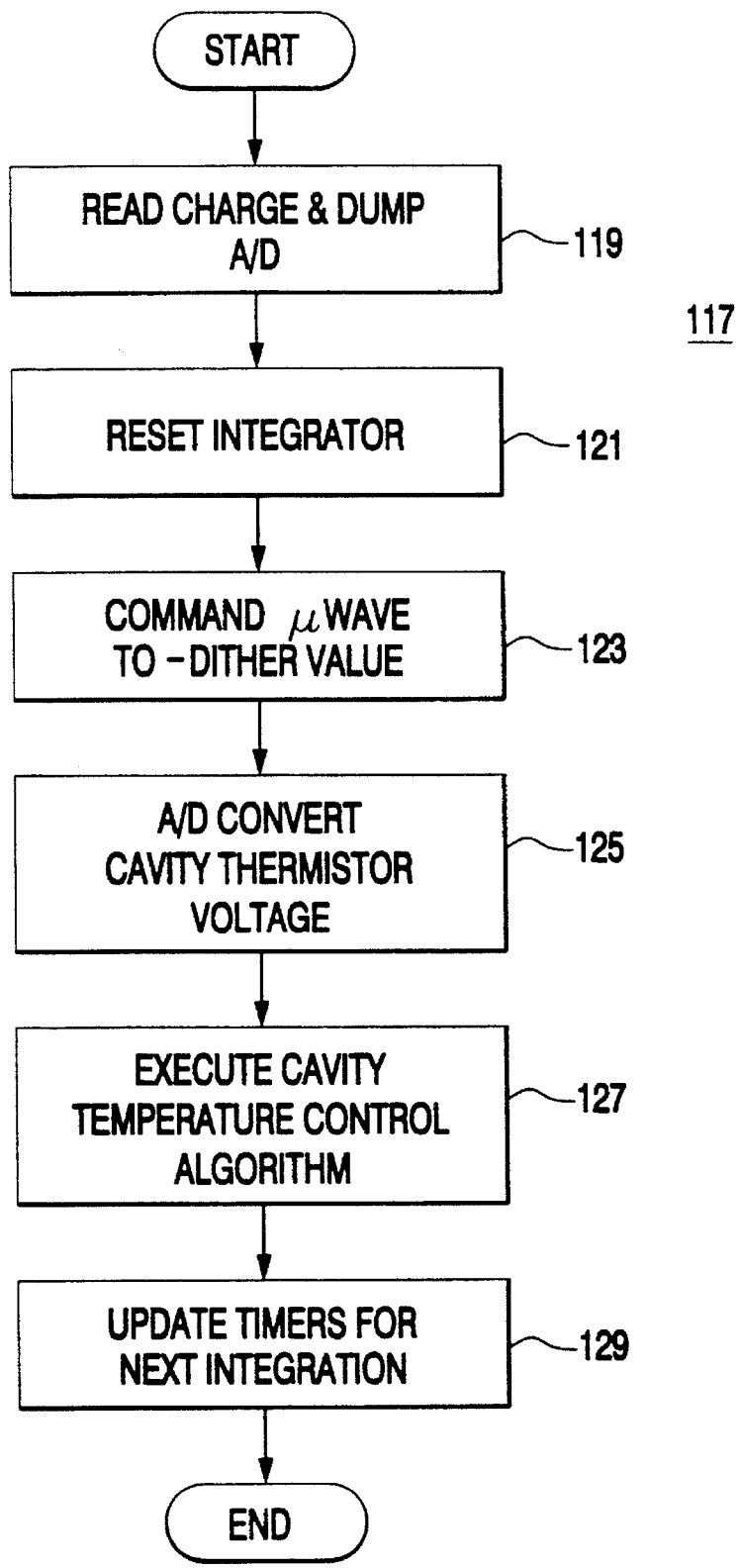

The flow chart for Time Slot 1 interrupt service routine 117 is shown in FIG. 5. After reading the A/D converter 63 at 119, which will contain the integrated value of the photodetector signal with the microwave control signal at its positive dither current value, the integrator 75 is reset at 121. With the integrator in reset, the DSP 27 sends the microwave minus dither current value to the D/A converter 41 as indicated at 123. The digital value of the cavity thermistor voltage is then read at 125 and the cavity temperature control algorithm is executed at 127 before the timers are updated for the next integration at 129.

Figure 6:
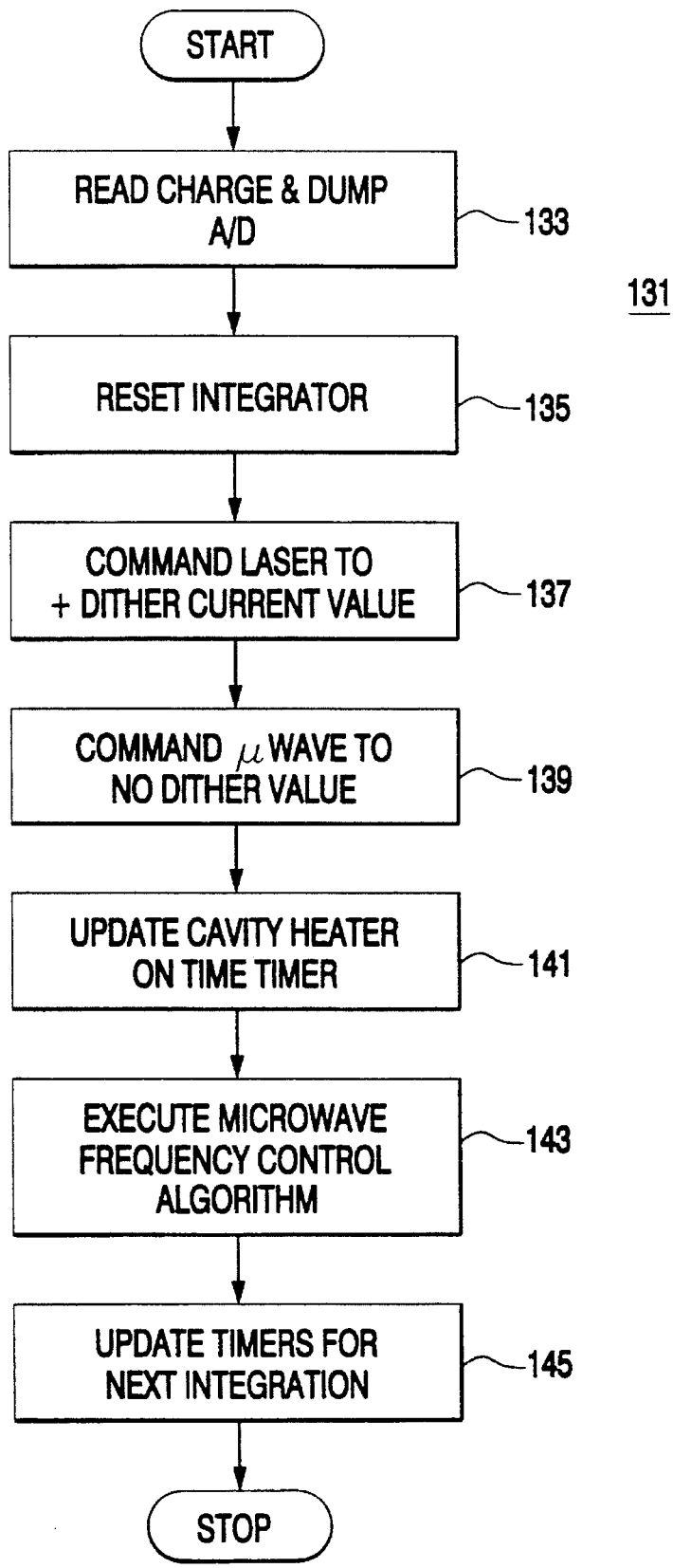

FIG. 6 illustrates the flow chart for the Time Slot 2 interrupt service routine 131. Again, the first task is to read the A/D converter at 133 which at this point contains the integrated value of the photodetector signal with the microwave signal at the minus dither current value. After the integrator 75 is reset at 135, the plus dither current value for laser current is sent at 137 to the D/A converter 43 associated with the laser current regulator 49. Then the no dither current value is sent to the D/A converter 41 of the RF frequency synthesizer 47 at 139. At 141, the turn-on time for the cavity heater is updated and sent to the DASIC. Next, the microwave frequency control algorithm is executed at 143 before the timers are all updated for the next integration at 145.

Figure 7:
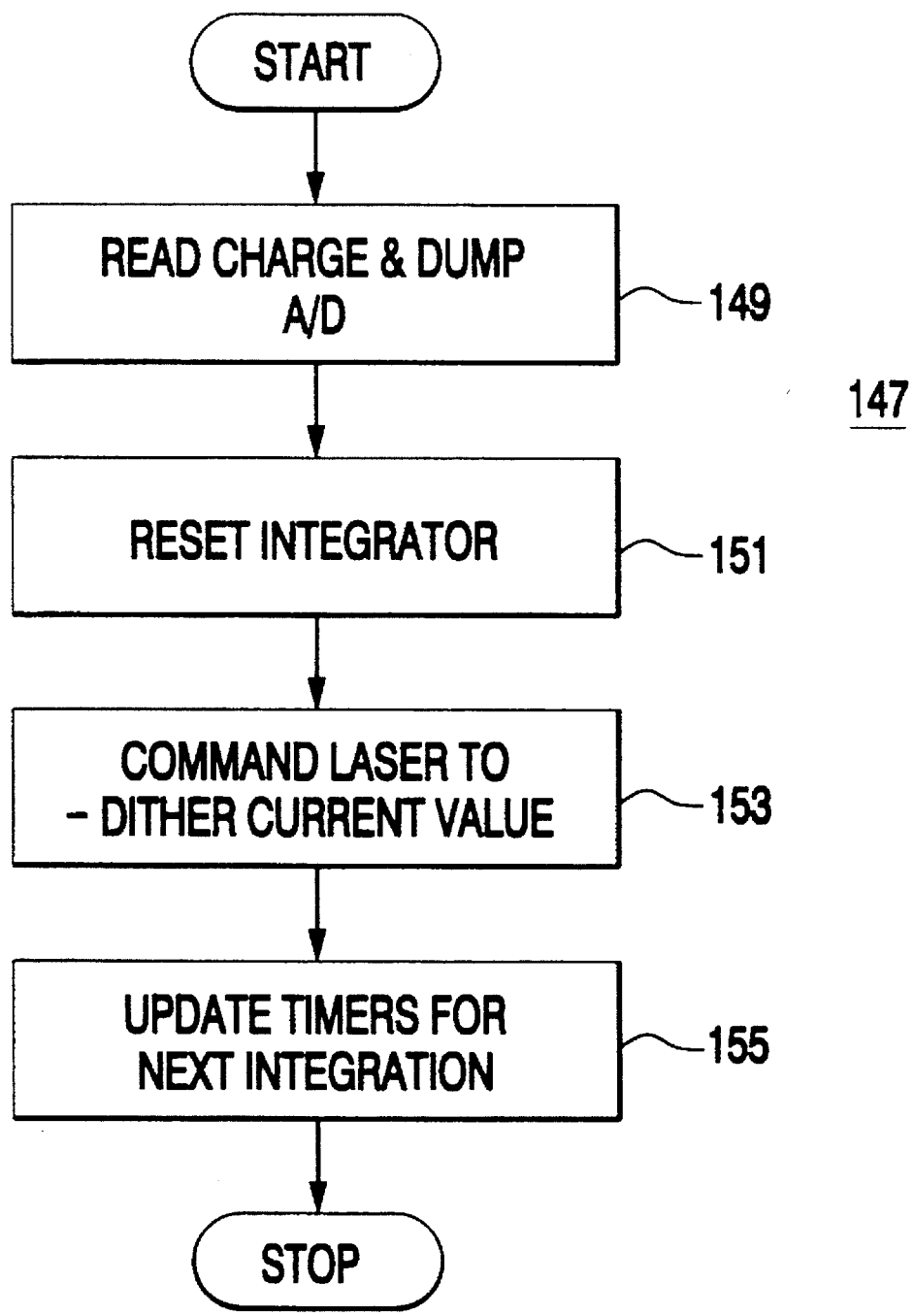

The flow chart for the Time Slot 3 interrupt service routine on 47 is shown in FIG. 7. The only functions performed at this time are to read the A/D converter at 149, reset the integrator 75 at 151, send the laser minus dither current value to the D/A converter 43 at 153, and update the timers for the next integration at 155.

Figure 8:
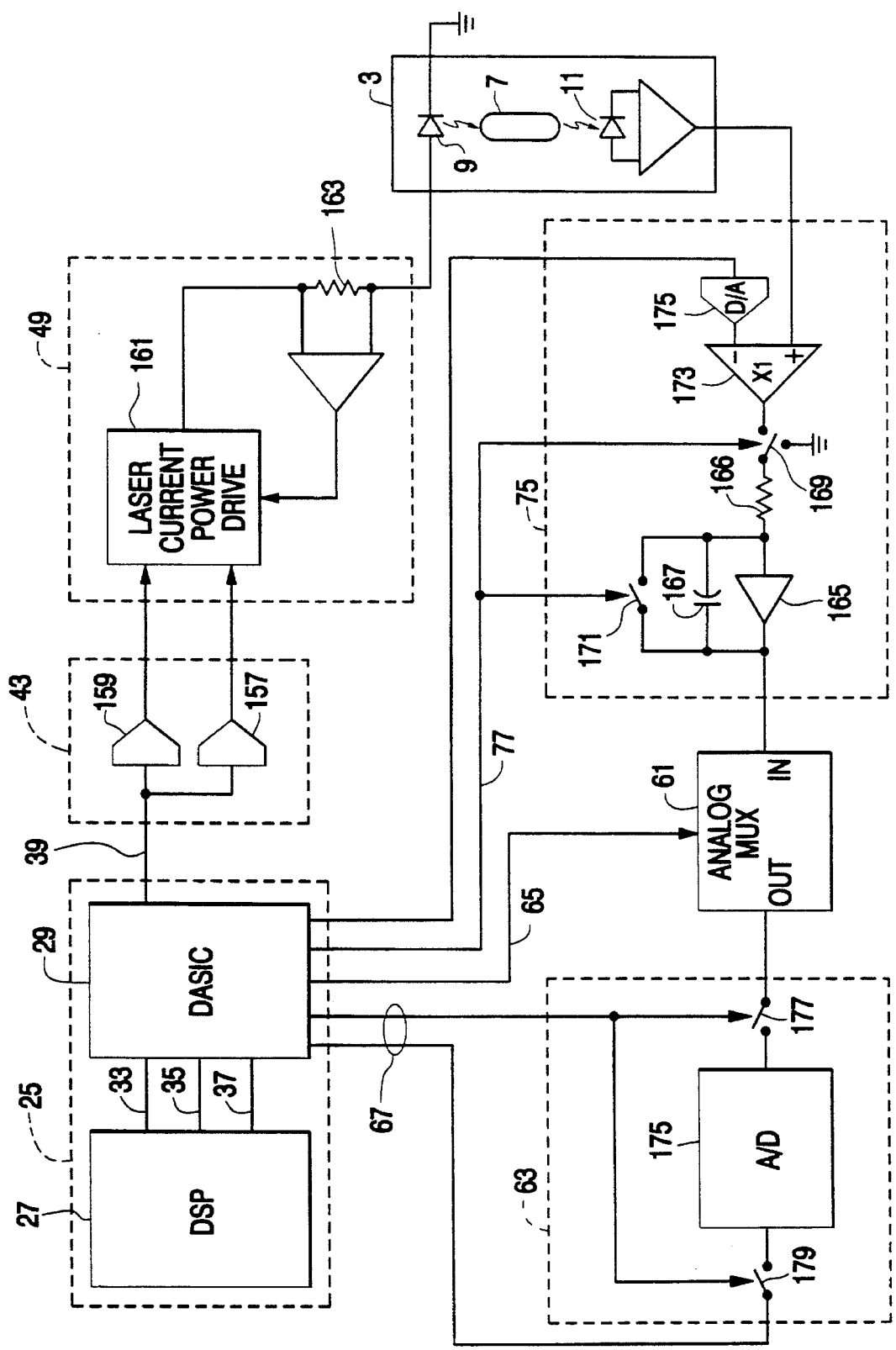
FIG. 8 is a schematic diagram illustrating the laser current control loop for the atomic frequency standard of FIG. 1.

FIG. 8 is a schematic diagram in more detail illustrating the laser current control loop in accordance with the invention. The wavelength of light emitted by the laser diode is a function of both laser current and temperature. Hence, regulation of the current and temperature is used to lock the laser wavelength on the optical resonant frequency of the cesium vapor. Laser temperature control is discussed in connection with FIG. 12 below. As previously mentioned, the main routine run by the DSP 27 outputs positive, negative and 0 dither values, depending upon the time slot, for laser current. The appropriate value is passed to the DASIC 29 over the parallel bus 35 where it is converted to serial format and transmitted over the serial bus 39 to the laser current digital-to-analog converter 43. This D/A converter 43 actually comprises a coarse D/A converter 157 and a fine D/A converter 159. Each of these converters 157 and 159 is 12 bit, but with a four bit overlap a 20 bit set point value for laser current is provided to the laser current power drive 161 within the laser regulator circuit 49. The laser current power drive 161 uses this set point value in a feedback loop which includes current measuring feedback resistor 163 to regulate the current supply to the laser diode 9 to the value commanded by the DSP 27 in an inner control loop.

The set point values for the laser current are derived in an outer control loop to maintain the laser locked on the optical resonance wavelength of the cesium vapor. This outer control loop includes the cesium cell 7 through which the light generated by the laser diode 9 passes and the photodetector 11 which responds to the amount of light from the laser diode which is not absorbed by the vapor in cell 7. The outer control loop further includes the charge and dump integrator 75, the analog Mux 61, the 16 bit A/D converter 63 and the digital controller 25. The integrator 75 includes the classic combination of an operational amplifier 165 fed through a resistor 166 and shunted by the integrating capacitor 167. When the set point value supplied to the D/A converter 43 is changed, the integrator 75 is reset by signals on a control lead 77 which opens a switch 169 to disconnect the input to the integrator and closes the switch 171 to discharge the capacitor 167 in preparation for the next integration. At the end of the reset period, the DASIC 29 closes the switch 169 and opens the switch 171 to initiate the new integration. In order to increase the dynamic range of the integrator 75, an offset value is subtracted from the photodetector signal by a difference amplifier 173. The offset is regulated to maintain the signal derived from the photodetector 11 as close to 0 as possible during positive dithering of the laser signal. This offset signal is digitally generated by the DSP 27 and converted to an analog signal by the D/A converter 175.

Figure 9:
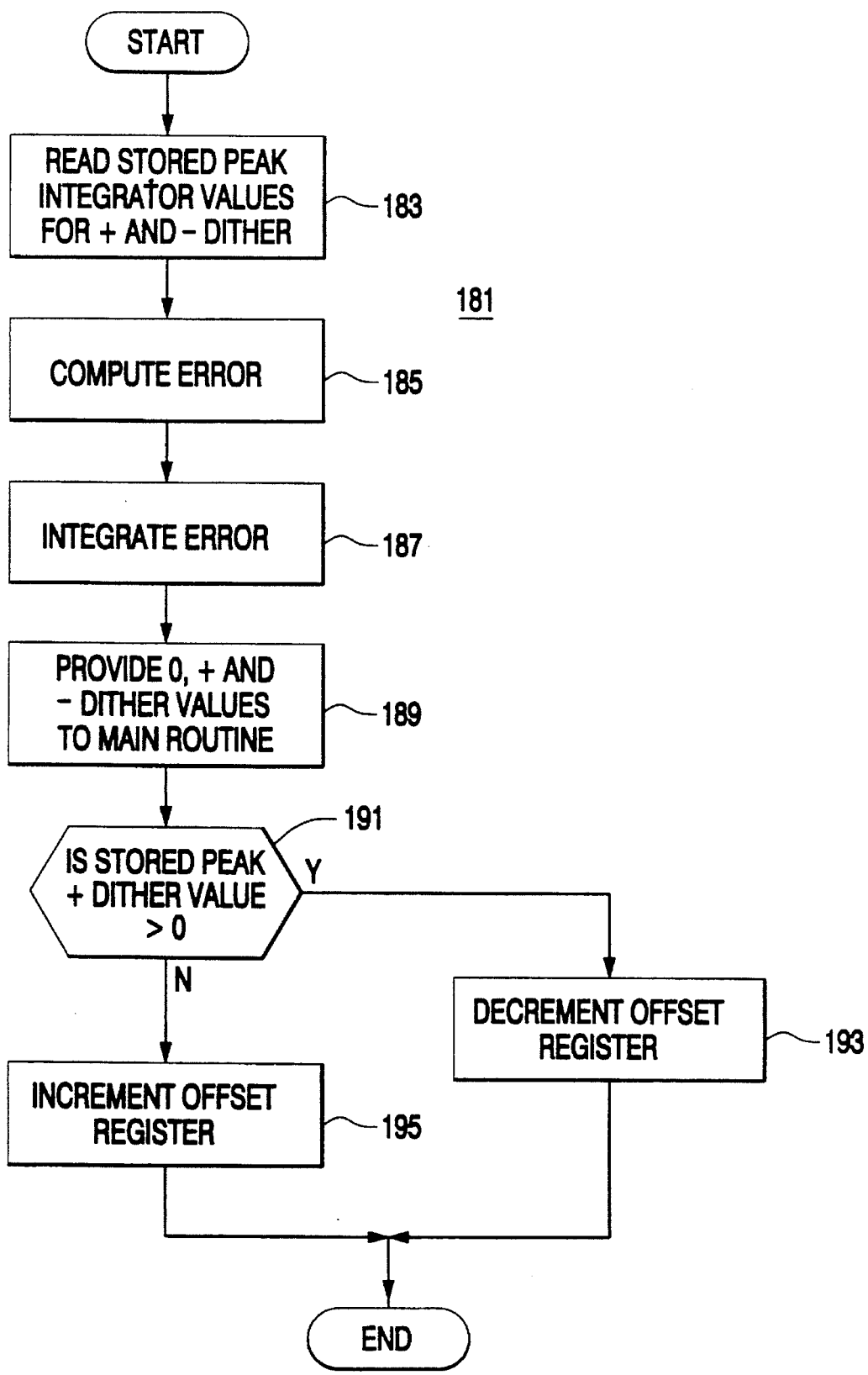
FIG. 9 is a flow chart for the laser current control software used in the laser current control loop of FIG. 8.

As previously discussed, the output of the integrator 75 is selected by the analog Mux 61 when the integrator is to be read. The 16 bit A/D converter 63 includes a sampling switch 177 which is closed by a signal from the DASIC 29 over the leads 67 to initiate the conversion. At the completion of the conversion, a switch 179 is closed to send the digital value to the DASIC for storage. A flow chart for the laser current control routine 181 is shown in FIG. 9. As described above, this routine is run by the Time Slot 0 interrupt service routine 111 in FIG. 4. As indicated at 183, the routine reads the stored peak integrator values for + and − dither recorded during the previous frame. The difference between the detector signal during + and − dithering of the laser current is then computed at 185. This error is used at 187 to generate the 0, + and − dither values for use by the main routine. The routine 181 also determines the offset value applied to the difference amplifier 173 through the D/A converter 175. This portion or the algorithm maintains the output of the difference amplifier 173 as close to 0 as possible during the time positive dither is present on the laser current. The absolute value of the photodetector output is not important, but the accurate determination of the difference in photodetector output due to laser current dither is crucial. If the stored integrated photodetector output during positive dither from the prior frame is greater than 0 as determined at 189, the offset register is decremented by 1 at 191. Otherwise it is incremented by 1 at 193. This action keeps the output of the difference amplifier 173 near 0 during positive laser dither, thereby maximizing the dynamic range of the analog integrator 75 in response to both the positive and negative laser dither current. This nulling also eliminates ac coupling of the photodetector 11, obviating the need for a large dc blocking capacitor.

To summarize the overall control of the laser current, at the beginning of Time Slot 0 of each frame, the set point value for the laser current is set to the 0 dither value. The laser current power drive 161 then drives the current laser current to this value. Later in the Time Slot 0, the main routine calls the laser current and temperature routines 181 shown in FIG. 9. The symmetrical shape of the output of the photodetector 11 as a function of laser current in the region of the laser absorption dip is used by the laser current algorithm to develop the error signal for the laser wavelength. If the laser wavelength is exactly on the cesium absorption dip, current dither results in equal photodetector output signals for positive and negative dither. Current dither under conditions of wavelength error results in unequal photodetector output signals. The difference in the outputs indicate the magnitude of the error and the sign of the difference indicates direction of the error. The laser current regulating routine integrates this error and generates laser 0, + and − values for the laser current.

At the beginning of Time Slot 2, the integrator 75 is reset by the Time Slot 2 interrupt service routine at 135 in FIG. 6. With the integrator 75 held in the reset condition, the plus dither current value is sent to the D/A converter 43 for the laser current power drive 161. The integrator remains in the reset condition while transients produced by the change in laser current dampen out. The DSP 27 then goes to sleep and the switch 169 in the integrator is closed and the switch 171 is opened to begin integration of the photodetector signal for the positive value of laser current. During this interval, the microwave signal is set to the no dither value. The integrator 75 amplifies the dc component of the photodetector output for positive laser dither while at the same time filtering out additive noise. At the beginning of Time Slot 3, the DASIC 29 generates the A/D sample signal which triggers the A/D converter 63 to perform a conversion of the integrator output. The DSP 27 then comes out of the sleep state and resets the integrator at 151 in FIG. 7. The minus dither current value is then sent to the A/D converter 43 as a set point for the laser current power drive 161, and when the transient has settled down the integrator begins integrating the photodetector output in response to the negative laser current dither. At the beginning of the next 0 time slot, the A/D sample signal is generated to begin the conversion of the integrated value of the minus laser dither.

The output of the integrator 75 for a dc input, $V_{in}$, is given by $V_{out}=T\times V_{in}/RC$ where R is the value of the integrator input resistor 166. In the exemplary configuration, the integration time T is approximately 1 ms, R=5100 ohms, and C, which is the capacitance of the integrating capacitor 167, is 0.01 µF. Therefore, the dc gain of the integrator 75 for laser wavelength control is 20.

Figure 10:
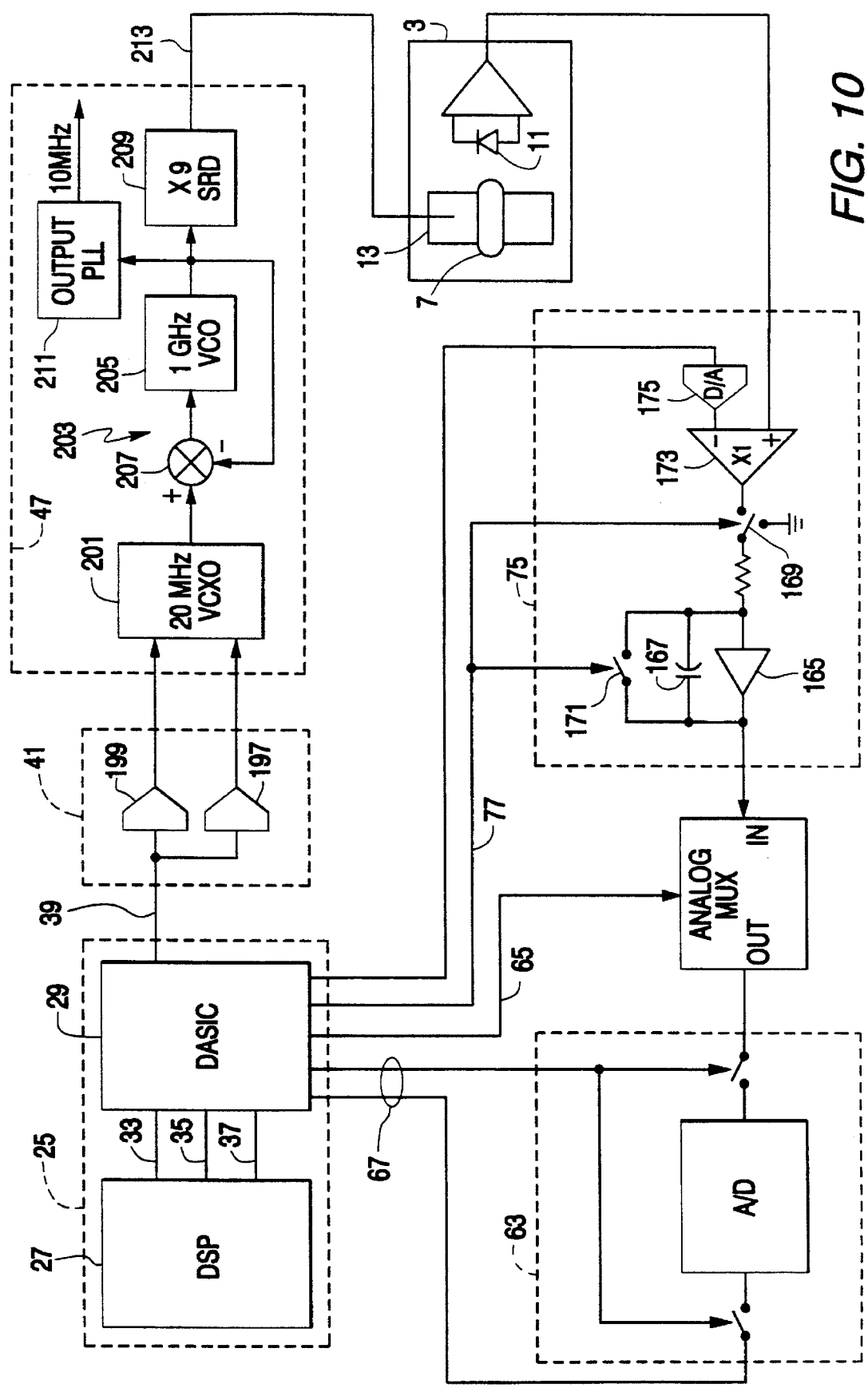
FIG. 10 is a schematic diagram illustrating the microwave frequency control loop for the atomic frequency standard of FIG. 1.

FIG. 10 is a schematic diagram illustrating details of the microwave frequency control loop in accordance with the invention. As previously mentioned, the main routine run by the DSP 27 time multiplexes dithering of the microwave frequency with the dithering of the laser current. Thus, during time slot 0 of each frame, the DSP 27 generates a + value for the microwave control signal which is passed to the DASIC 29 over the parallel bus 35. The DASIC 29 converts this microwave control signal to serial format and transmits it over the serial bus 39 to the microwave frequency synthesizer D/A converter 41. The D/A converter 41 actually comprises a 16 bit coarse D/A converter 197 and a 16 bit fine D/A converter 199 having an approximate 6 bit overlap with the coarse D/A converter to provide a 26 bit digital control signal. The analog outputs of the D/A converters 197 and 199 serve as the set point input for the RF frequency synthesizer 47 which converts the combined analog input signal to the microwave signal applied to the cesium vapor. This RF frequency synthesizer 47 includes a 20 MHz crystal controlled voltage controlled oscillator (VCXO) 201. The output of the 20 MHz VCXO is used as the input for a 1 GHz phase lock loop 203 which includes a 1 GHz voltage controlled oscillator (VCO) 205 the output of which is subtracted from the output of the 20 MHz VCXO 201 in a phase comparator 207 to generate an error signal which drives the 1 GHz VCO 205. The output of the phase lock loop 203 drives a frequency multiplier 209 in the form of a step recovery diode (SRD) multiplier with a multiplication factor of 9 to produce the approximately 9 GHz microwave signal. In addition, the output of the 1 GHz phase lock loop 203 is used to discipline a 10 MHz output phase lock loop 211 which provides as an output the stable 10 MHz clock output signal.

The microwave signal generated by the RF frequency synthesizer 47 is applied through coaxial cable 213 to the microwave cavity 13 in the physics package 3 in a manner which is known in the art. This microwave signal repopulates the ground state of the cesium vapor when tuned to the microwave resonant frequency. This tuning of the microwave signal results in a microwave dip in the output of photo detector 11. The photo detector output signal is integrated by the charge/sample and dump integrator 75 in the manner discussed above in connection with the laser current control loop through operation of the switches 169 and 171 in response to control signals generated by the DASIC 29. As in the case of the laser current, the output of the integrator 75 is read at the end of each integration period by selection of the integrator by the analog mux for conversion by the A/D converter 63.

To summarize the operation of the microwave frequency control loop, at the beginning of Time Slot 0, the DSP 27 wakes up and sets the microwave control signal to the positive dither value as indicated at 109 in FIG. 4. During the short interval that the DSP is on during Time Slot 0, the microwave power control algorithm calculates the laser power value for use in the next frame at 113 in FIG. 4. Meanwhile, the DASIC 29 resets the integrator 75, and when the transients have settled, initiates integration of the photo detector signal in response to the positive microwave dither.

At the beginning of Time Slot 1, the integrated value of the positive microwave dither is read, the integrator is reset and the microwave dither is set to the negative value at 123 in FIG. 5. The DSP 27 after completing its assigned tasks goes to sleep, and the integration of the negative dither signal is commenced. At the beginning of Time Slot 2 the integrated value of the negative dither signal is read, and then the microwave dither is set to the 0 value where it remains throughout Time Slot 2 and Time Slot 3.

The integration time of the charge/sample and dump integrator 75 for the microwave frequency control loop is 2.5 mS. Utilizing the formula presented above in connection with the laser current control loop it can be seen that the dc gain applied to the photo detector signal in the microwave frequency control loop is 50. As in the case of the laser current loop, the integrator 75 integrates to zero all noise frequency components that are integral multiples of one/T. It is also well known that the signal to noise ratio of an integrator with white noise improves with the square root of time.

The microwave frequency control algorithm executed at 143 in the Time Slot 2 interrupt service routine 131 shown in FIG. 6 is similar to the routine 181 illustrated in FIG. 9 for the current control algorithm. In addition to generating the positive, negative and 0 dither values for the microwave control signal, this routine also adjusts the bias applied to the differential amplifier 173 through the D/A converter 175 to maintain the integrated value of positive microwave frequency dither as close to zero as possible, to increase the dynamic range of the control loop.

Figure 11:
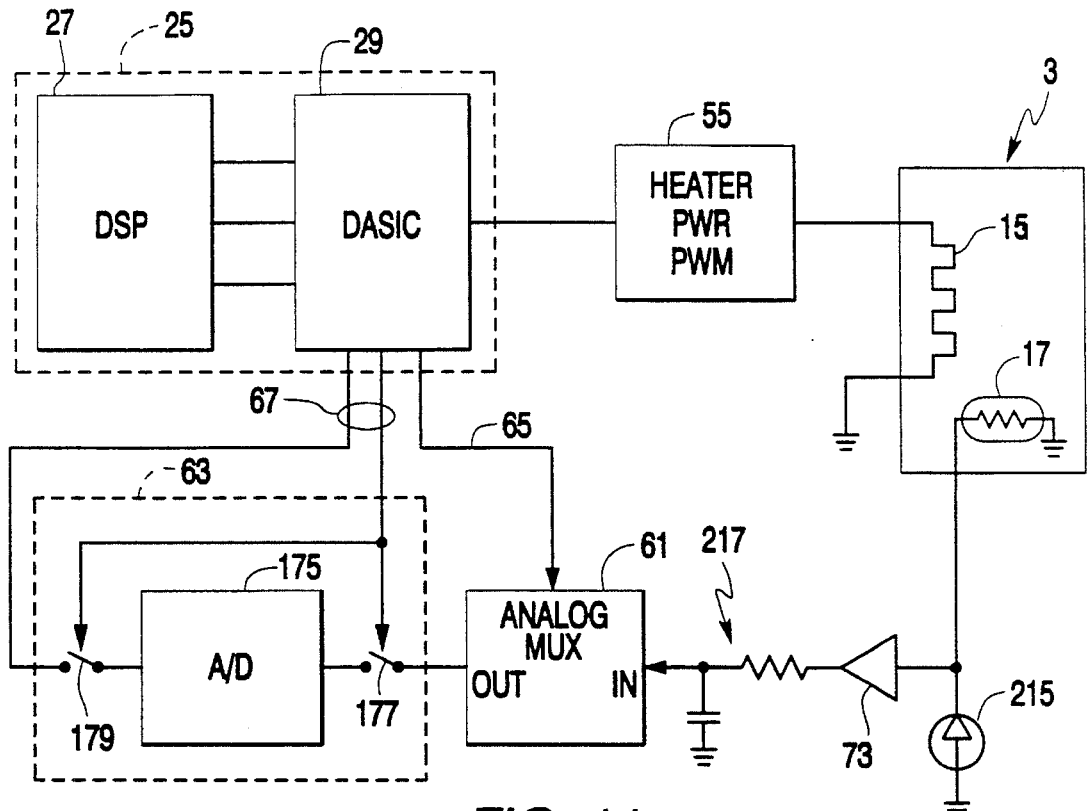
FIG. 11 is a schematic diagram of a cesium heater control loop.

The cesium vapor heater control loop is illustrated schematically in FIG. 11. Power is provided to the heater 15 by the heater power pulse width modulator (PWM) 55. Feedback is provided by the cesium thermistor 17 powered by a 100 μα constant current source 215. The voltage across the thermistor 17, which is a measure of the temperature of the cesium cell, is amplified by the op amp 73 and filtered by the low pass noise filter 217. As previously discussed, the heater 15 is not energized during the time slots when the microwave signal is being measured because the field generated by the heater, which is located inside the shielding to minimize power requirements, can disturb the stability of the microwave frequency. Accordingly, the heater is only turned on during laser dithering which is not affected by the heater. As indicated at 125 in FIG. 5, the voltage on the cesium thermistor 17 is read by the Time Slot 1 service routine. Although this occurs while the microwave frequency is on positive dither, the heater is turned off at this point. The analog mux 61 selects the cesium thermistor voltage for conversion by the A/D converter 63 for input to the digital processor 25. The DSP 27 in the controller 25 compares this feedback voltage with the set point voltage to generate an error. This error in turn is applied to a digital filter which incorporates an integrator to generate a pulse width modulate signal which determines the intervals during which the heater is turned on. The DASIC 29 converts this pulse width modulate signal generated by the DSP into a simple on/off control signal for the heater power PWM 55. This control signal is generated by the DASIC using a register loaded with the pulse width modulate signal generated by the DSP, a counter incremented by a timer, and a comparator which compares the count with the register. When the count equals the register, the control signal goes high to turn on the heater power PWM 55. The register is only loaded during Time Slots 2 and 3 when the laser frequency is being dithered. The time during these time slots when the heater is turned on is determined by the magnitude of the pulse width modulate signal. The larger this signal, the sooner in the time period the heater is turned on. The heater is turned off by resetting the control signal to 0 at the end of each of these time slots. This simple control arrangement eliminates the need for a separate D/A converter for the heater circuit. While the heaters are only turned on periodically during normal operation, they may be turned on continuously at start-up to reduce warm-up time.

Figure 12:
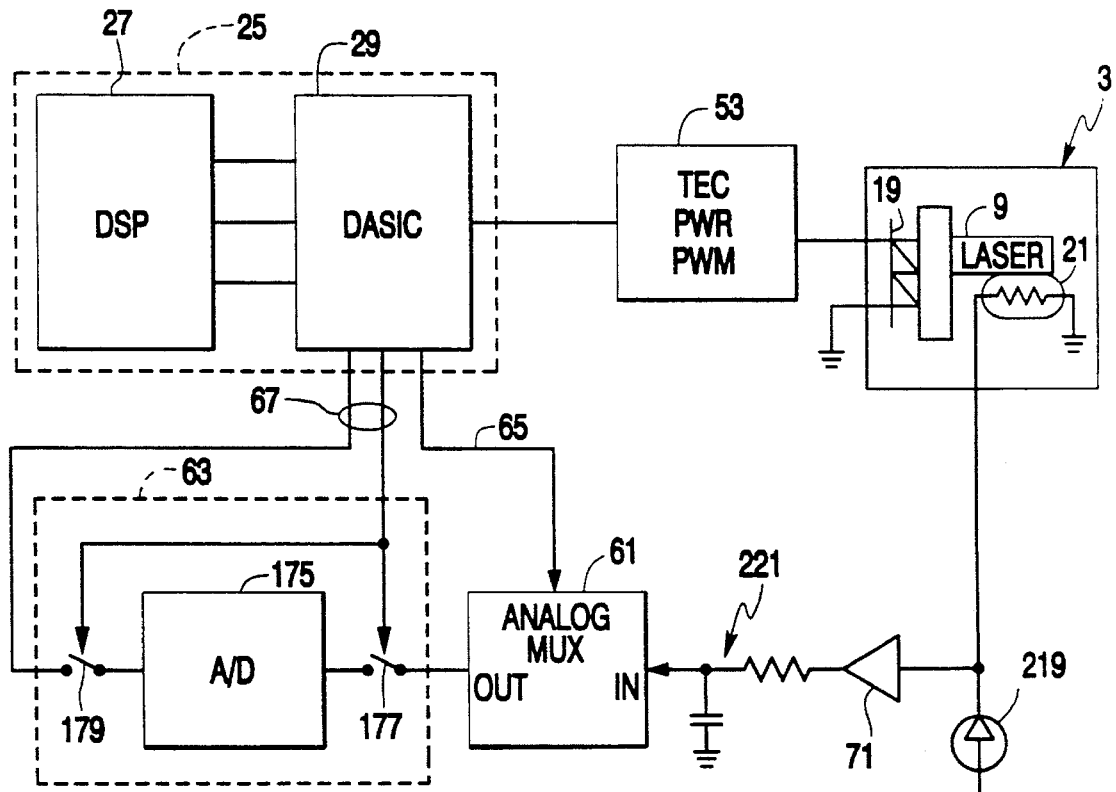
FIG. 12 is a schematic diagram of the laser temperature control loop.

The control loop for the TEC controlling the temperature of the laser is similar to that for the heater just described. Thus, as shown in FIG. 12, the DASIC 29 generates a simple on/off control signal for the TEC power PWM 53. When the TEC power PWM 53 is turned on, the TEC 19 is energized. Feedback of the temperature of the laser 9 is provided by the laser thermistor 21 which, as in the case of the cesium thermistor, is energized by a 100 μα constant current source 219. The voltage across the thermistor 21 representing the temperature of the laser is amplified by the op amp 71 and filtered by the noise filter 221. This voltage is selected by the analog mux 61 for digitizing by the A/D converter 63 immediately after the cavity thermistor is read. The DSP 27 compares this actual voltage value with a set point value to generate a pulse width modulate signal used by the DASIC to generate the off/on control signal in the manner discussed in connection with the cesium heater control loop.

The laser thermistor feedback signal is only used to control the TEC during warmup. Once, the laser dip is found, the DSP 27 generates the PWM signal used by the DASIC 29 to control the TEC as a function of the difference between actual laser current, as determined from the photodetector signal in the laser current loop, and a set point value for laser current. This maintains laser power at a fixed value which increases clock stability since laser wavelength varies to some degree with power.

The C-field coil current is regulated to a digital set point value provided by the digital controller 25 and converted to an analog signal by the D/A converter 45 as shown in FIG. 1. The C-field current regulator 51 then regulates the current for the coil 23 in a feedback loop similar to the inner loop described in connection with a laser current control.

Figure 13:
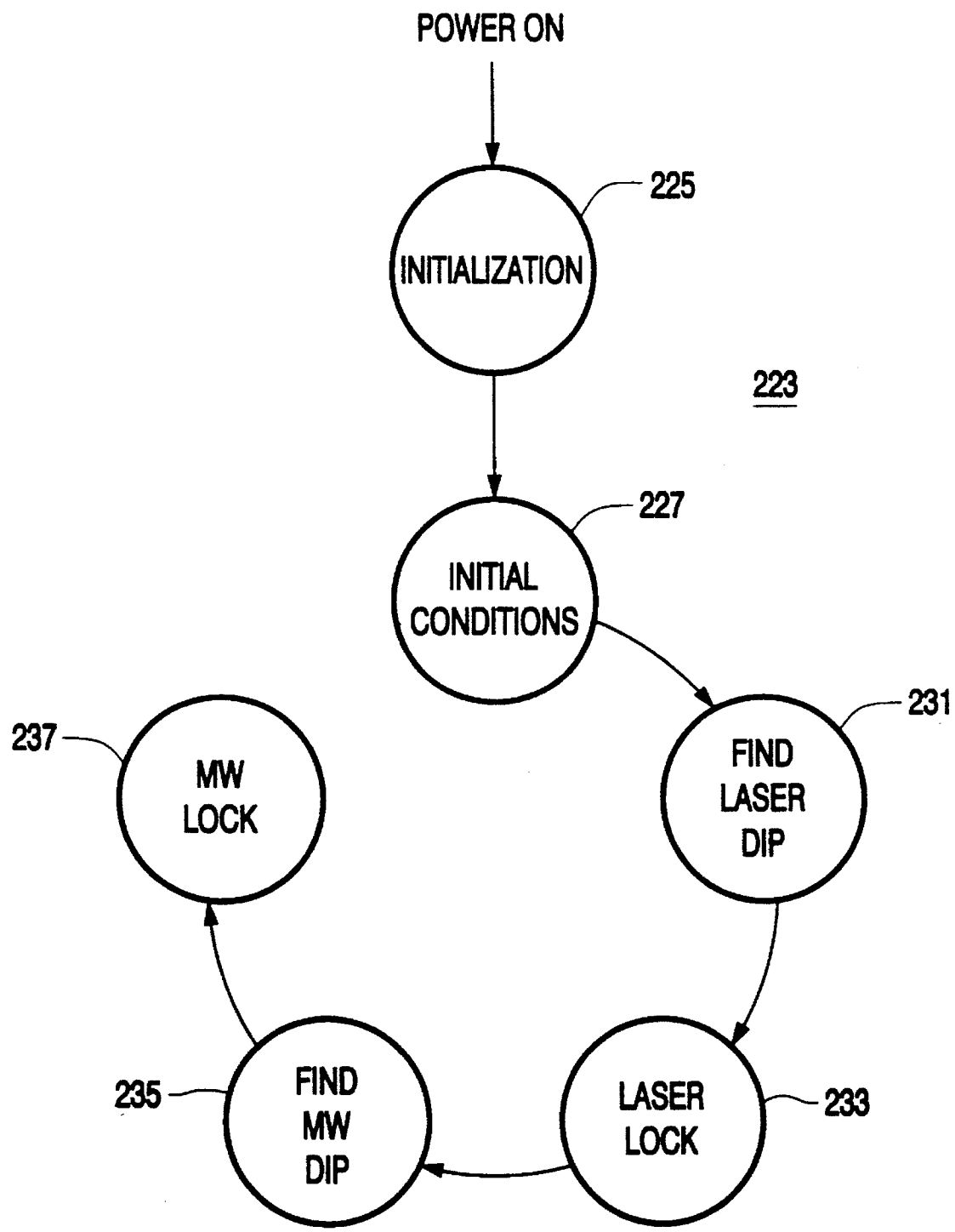
FIG. 13 is a state diagram illustrating the operating states of the software used to control the atomic frequency standard of the invention.

The software of the atomic frequency standard 1 of the invention may be described as a finite state machine operating in real time. A software state transition diagram 223 is shown in FIG. 13. A state defines the behavior of the frequency standard and is represented as a circle in the figure. Program logic determines the transitions from one state to another. The transitions are represented by arrows between the states.

The Initialization state 225 is the state entered upon application of power to the frequency standard 1. In this state the digital controller 25 and its peripherals are initialized. At the end of the initialization state timer interrupts are enabled and the state is changed to the initial conditions state 227.

The initial conditions state 227 establishes the temperature control of critical components within the physics package 3. During the initial conditions state 227 the laser temperature control and cesium cell temperature control algorithms are executed. The laser is driven with a fixed current that is slightly above the desired operating point. The C-field current is set to zero. The coarse and fine D/A converters 157, 159 that drive the RF frequency synthesizer 47 are set to a minimum and mid range value respectively. The software transitions to the find laser dip state 231 only after both temperature control algorithms compute laser and cesium cell temperature errors which are within programmable limits.

The find laser dip state 231 coarsely tunes the laser diode wavelength to a cesium absorption dip. During the find laser dip state 231 the laser temperature control and cesium gas temperature control algorithms are executed. The laser current is ramped downward from the coarse value. During the ramping, the physics package photodetector voltage is read by the digital controller 25 through the 16 bit A/D 63. Detection of a lock minimum signifies the laser is coarsely tuned to the cesium absorption dip. The software will not transition to the operate laser lock state if a dip is found unless and until the laser temperature control algorithm computes an error less than a programmable limit. The C-field current, RF power, and RF frequency drive are not affected.

During this state 231, the digital controller 25 executes an algorithm that coarsely minimizes the output of the photodetector difference amplifier, in preparation for execution of the wavelength control algorithm and the microwave dip search algorithm.

The algorithm will ramp the current to a minimum value. If a dip is not detected by the time the minimum current is reached, an error has occurred. In the present design, if no dip is found, the software stays in the find laser dip state 231.

The laser lock state 233 precisely tunes the laser wavelength to the cesium absorption dip found in the previous state by controlling the laser current and temperature. During the laser lock state 233 cesium gas temperature control algorithm is executed. The laser temperature control algorithm is also executed, but it is now driven by the difference between the actual laser current and a laser current setpoint, rather than by the laser thermistor feedback signal. This tends to keep the laser power fixed. The C-field current and RF frequency drive are not affected. The laser wavelength control algorithm is executed. An algorithm is executed that precisely nulls the output of the photodetector difference amplifier 12 in preparation for the microwave dip search algorithm.

The software transitions to the find microwave dip state 235 only after the wavelength control algorithm computes laser current errors less than a programmable limit and the photodetector difference amplifier has been precisely nulled. Both of these conditions must exist for approximately four minutes. During the find microwave dip state 235 the laser temperature control, cesium gas temperature control, and laser wavelength control algorithms are executed.

The C-field current is set to a programmable value and the coarse RF frequency synthesizer D/A converter 41 is ramped up and dithered. The dither error is computed and compared to a threshold value. Any error above the threshold indicates the presence of the RF dip in the cesium gas. The software transitions to the microwave lock state, 237 upon detection of the RF dip. Failure to find an RF dip keeps the system in the find microwave dip state 235.

The microwave lock state 237 is the steady state operating state of the frequency standard 1. During the microwave lock state 237 the laser temperature control, cesium gas temperature control, and laser wavelength control algorithms are executed. The RF frequency control loop is executed using the fine RF frequency control D/A converter. Once the frequency error in the frequency control loop drops below a predefined threshold, a lock indicator is activated and the frequency standard is fully operational.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An atomic frequency standard comprising:

a confined volume of a vapor having specified atomic transition frequencies/wavelengths including an optical resonance wavelength and a microwave atomic transition frequency;

frequency synthesizer means generating a microwave signal in a frequency range including said microwave atomic transition frequency;

means coupling said microwave signal to said vapor;

a laser diode optically pumping said vapor with light at a wavelength within a range including said optical resonance wavelength;

detector means generating a detector signal representing light from said laser diode which has passed through said vapor; and control means comprising digital processing means responsive to said detector signal for operating said frequency synthesizer to regulate said microwave signal as a function of said atomic transition frequency, and for operating said laser diode to stabilize the wavelength of the light generated relative to said optical resonance wavelength wherein said digital processing means comprises means generating a microwave control signal which is applied to said frequency synthesizer and for dithering said microwave control signal to drive said microwave signal generated by said frequency synthesizer to frequencies centered on said microwave atomic transition frequency.

2. The atomic frequency standard of claim 1 wherein said digital processing means comprises means for generating a light wavelength control signal which is applied to said laser diode and for dithering said light control signal to drive said light wavelength generated by said laser diode to wavelengths centered on said optical resonance wavelength, and means for time multiplexing said dithering of said microwave control signal and said light control signal.

3. The atomic frequency standard of claim 2 wherein said means dithering said microwave control signal and said light control signal comprises means alternating values of said microwave control signal and said light control signal to produce first and second values of said detector signal, and wherein said control means comprises integrator means integrating said first and second values of said detector signal to generate first and second integrated values of said detector signal, and means for inputting said first and second integrated values to said digital processing means.

4. The atomic frequency standard of claim 3 wherein said digital processing means includes means limiting operation of said digital processing means while said first and second values of said detector signal are being integrated by said integrator means to reduce noise in said first and second integrated values of said detector signal.

5. The atomic frequency standard of claim 3 wherein said integrator means comprises a common integrator integrating said first and second detector signals in response to dithering of both said microwave control signal and said light control signal.

6. The atomic frequency standard of claim 3 wherein said control means includes means subtracting a bias signal from said first values of said detector signal to generate modified first values of said detector signal which are applied to said integrator means, and wherein said digital processing means includes means generating said bias signal to drive said modified first value of said detector signal toward 0.

7. The atomic frequency standard of claim 2 wherein said control means includes means measuring said detector signal during a first interval while said microwave control signal is being dithered and during a second interval when said light control signal is being dithered, and wherein said digital processing means includes means limiting operation of said digital processing means while said detector signal is being measured during said first and second intervals.

8. The atomic frequency standard of claim 2 wherein said control means includes electrical heater means for heating said confined vapor and wherein said digital processing means includes means controlling energization of said electrical heater means so that said electrical heater means is not energized while said microwave control signal is being dithered.

9. The atomic frequency standard of claim 1 wherein said control means incudes electrical heater means for heating said confined vapor and wherein said digital processing means comprises time multiplexing means responding to said detector signal for adjusting said microwave signal during first repetitive intervals, and responding to said detector signal for regulating said light signal during second repetitive intervals, and means energizing said electrical heater means at times other than during said first repetitive intervals.

10. The atomic frequency standard of claim 1 wherein said control means includes integrating means for integrating said detector signal during predetermined time intervals to generate an integrated detector signal, and means for inputting said integrated detector signal generated during each said time interval into said digital processing means, said digital processing means further comprising means putting said digital processing means in a sleep mode during said predetermined time intervals.

11. The atomic frequency standard of claim 1 wherein said digital processing means operating said laser diode comprises means regulating current applied to said laser diode to stabilize the wavelength of the light generated relative to said optical resonance wavelength.

12. The atomic frequency standard of claim 11 wherein said digital processing means further comprises means regulating temperature of said laser diode as a function of actual laser current and a reference value of laser current.

* * * * *